(12) United States Patent
Lee et al.

(10) Patent No.: US 10,868,160 B2
(45) Date of Patent: Dec. 15, 2020

(54) NEUROMORPHIC DEVICES AND CIRCUITS

(71) Applicant: SEOUL NATIONAL UNIVERSITY R&DB FOUNDATION, Seoul (KR)

(72) Inventors: Jong-Ho Lee, Seoul (KR); Sung Yun Woo, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 816 days.

(21) Appl. No.: 15/612,319

(22) Filed: Jun. 2, 2017

(65) Prior Publication Data

US 2017/0352750 A1  Dec. 7, 2017

Related U.S. Application Data

(60) Provisional application No. 62/345,179, filed on Jun. 3, 2016.

(51) Int. Cl.
*H01L 29/749* (2006.01)
*H01L 29/423* (2006.01)
(Continued)

(52) U.S. Cl.
CPC .......... *H01L 29/749* (2013.01); *G06N 3/049* (2013.01); *G06N 3/0445* (2013.01);
(Continued)

(58) Field of Classification Search
CPC ............. H01L 29/749; H01L 29/40117; H01L 29/42308; H01L 29/42344; H01L 29/513;
(Continued)

(56) References Cited

U.S. PATENT DOCUMENTS 6,583,452 B1 * 6/2003 Cho .................... H01L 27/0817
257/107
6,690,038 B1 * 2/2004 Cho .................... H01L 27/0617
257/133

(Continued)

FOREIGN PATENT DOCUMENTS

WO    2009113993    9/2009

OTHER PUBLICATIONS

Indiveri, et al., Neuromorphic silicon neuron circuits, Frontiers in Neuroscience, vol. 5, May 31 2011, pp. 1-23.
(Continued)

*Primary Examiner* — Nathan W Ha
(74) *Attorney, Agent, or Firm* — Cantor Colburn LLP

(57) ABSTRACT

Provided are a neuromorphic device and a neuromorphic circuit using the neuromorphic device. The neuromorphic device is configured to include a first semiconductor region formed on a substrate in a wall shape or a dumbbell shape; first, second, third, and fourth doped regions sequentially formed in the first semiconductor region; first and second gate insulating film stacks disposed on the respective side surfaces of the second doped region; first and second gate electrodes respectively disposed on the respective side surfaces of the second doped region; the first and second gate electrodes disposed on the respective side surface of the second doped region, the first and second gate electrodes being electrically insulated from the second doped, region by the first and second gate insulating film stacks; and first and second electrodes electrically connected to the first and fourth doped regions, respectively.

20 Claims, 16 Drawing Sheets

(51) Int. Cl.
| | |
|---|---|
| *H01L 29/66* | (2006.01) |
| *H01L 21/28* | (2006.01) |
| *G06N 3/04* | (2006.01) |
| *G06N 3/063* | (2006.01) |
| *H01L 27/102* | (2006.01) |
| *H01L 29/51* | (2006.01) |
| *H01L 29/74* | (2006.01) |
| *H01L 29/792* | (2006.01) |
| *H03K 3/012* | (2006.01) |
| *H01L 29/78* | (2006.01) |

(52) U.S. Cl.
CPC ....... *G06N 3/0635* (2013.01); *H01L 27/1027* (2013.01); *H01L 29/40117* (2019.08); *H01L 29/42308* (2013.01); *H01L 29/42344* (2013.01); *H01L 29/513* (2013.01); *H01L 29/66833* (2013.01); *H01L 29/7436* (2013.01); *H01L 29/792* (2013.01); *H03K 3/012* (2013.01); *H01L 29/7855* (2013.01)

(58) Field of Classification Search
CPC ............. H01L 29/66833; H01L 29/792; H01L 27/1027; G06N 3/0445; G06N 3/0635
See application file for complete search history.

(56) References Cited

U.S. PATENT DOCUMENTS

| | | | | |
|---|---|---|---|---|
| 2014/0091358 | A1* | 4/2014 | Blanchard | H01L 29/42308 257/139 |
| 2014/0319623 | A1* | 10/2014 | Tsai | H01L 29/42364 257/401 |
| 2015/0028278 | A1* | 1/2015 | Lee | H01L 29/512 257/2 |
| 2016/0055408 | A1* | 2/2016 | Akopyan | G06N 3/04 706/26 |
| 2016/0133317 | A1* | 5/2016 | Lee | H01L 27/11568 257/314 |
| 2017/0084619 | A1* | 3/2017 | Wenxu | G11C 11/5685 |
| 2017/0109624 | A1* | 4/2017 | Park | H01L 45/085 |
| 2017/0194337 | A1* | 7/2017 | Lee | H01L 29/7926 |
| 2017/0194446 | A1* | 7/2017 | Lee | H01L 29/7827 |

OTHER PUBLICATIONS

Bhattacharya, et al., FinFETs: From Devices to Architectures, Advances in Electronics, 2014, pp. 1-21.
Tohara, et al., Silicon nanodisk array with a fin field-effect transistor for time-domain weighted sum calculation toward massively parallel spiking neural networks, Appl. Phys. Express, 2016.

* cited by examiner

NEUROMORPHIC DEVICES AND CIRCUITS

BACKGROUND OF THE INVENTION

1. Field of the Invention

The present invention relates to a neuromorphic device in a technique capable of imitating a neuron with a low power and a high degree of integration in a neuromorphic technique.

2. Description of the Prior Art

In recent years, in integrated circuits (von-Neumann-based integrated circuits) based on the Von Neumann architecture, power consumption has been greatly increased and the problem of heat release has been very serious. Therefore, many approaches to imitate nervous systems of animals have been studied. In particular, in techniques of imitating the nervous systems of animals the power consumption can be greatly reduced, and a cognitive function and learning are enabled, so that the cognitive function and s determination function can be improved.

Accordingly, there is art opportunity to replace or greatly improve the functions of the existing von-Neumann-based integrated circuits. Therefore, much attention has been increasingly paid on the techniques of imitating the nervous systems of animals, and there is much need to study the techniques of imitating the nervous system of animals.

A basic function of a neuron is to generate an electrical spike (signal) from a stimulus exceeding a threshold value and transmit information to another cell. The generated electrical signal is called an action potential. A neuron may be divided into three portions. Namely, the neuron includes a nerve cell body where a nucleus exists, a dendrite which receives a signal from another cell, and an axon which transmits a signal to another cell. A portion which transmits a signal between the dendrites is called a synapse.

The neuron receives a stimulus from another nerve cell or a stimulus receptor cell and transmits the stimulus to another nerve cell or a glandular cell. Exchanging stimuli occurs in the synapse. One nerve cell (neuron) receives stimuli through a plurality of the synapses to integrate excitations, and after that, the nerve cell transmits an electrical spike to an axon near to the nerve cell body, so that the electrical spike reaches the synapse.

In this manner, the transmission of excitations from the neuron through the synapse to another nerve cell is referred to as excitation transmitting. The excitation in the synapse is transmitted only in the direction from a nerve fiber to a nerve cell body or a dendrite and is not transmitted in the reverse direction. As a whole, the synapse transmits the excitation only in the one direction.

In addition, the synapse is a relay site of transmitting the excitations, and the synapse applies a weighting factor according to temporal or spatial change of excitations reaching the synapse or inhibiting the excitations to enable a high-level integrating function of the nerve system.

On the other hand, besides the synapse which transmits the excitations, there are some synapses having a function of inhibiting the excitations of the nerve cell. The synapse having the function is called an inhibitory synapse. When, the excitation transmitted along nerve fiber reaches the inhibitory synapse, the synapse secretes an inhibitory transmitting material. The inhibitory material acts on a membrane of the nerve cell connected to the synapse to inhibit excitations of the cell from occurring (occurrence of an action potential). As a result, while the inhibitory transmitting material acts, the excitation reaching another synapse is not transmitted to the synapse.

In this manner, the neuron performs an excitation transmitting function of transmitting excitations received from one or more nerve cells through the synapse to another nerve cell, an excitation integrating/transmitting function of integrating excitations received from a plurality of nerve cells and transmitting an integrated excitation to another nerve cell, or an execution inhibiting function of inhibiting an excitation from be transmitted from another nerve cell.

A CMOS-based neuron circuit in the related art is configured to include a capacitor responsible for an integrate function, a comparator that fires when a signal equal to or higher than a specific threshold value is applied, and additional circuits for delay and stability. Accordingly, the CMOS-based neuron circuits in the related art have the problems in that, due to a large size of the integrate capacitor, the entire area is greatly increased, and due to an increase in the number of elements, the area is increase, and the power consumption is also increased. Due to these structural limitations, there are problem in that the configuration of the neuromorphic system is complicated, and there is a limitation in terms of accuracy.

Therefore, in the invention, a neuromorphic device and a neuromorphic circuit are proposed where, as a substitute for the integrate capacitor having a large area, a gate insulating film stack having a charge storage layer is contrived, and in order to simplify a circuit having, a firing function, a positive feedback is allowed to occur in an element itself.

SUMMARY OF THE INVENTION

The invention is to provide a neuromorphic device and a circuit having excellent reliability, a low power, and a high degree of integration while solving the problems of a large area and high power consumption of a neuron circuit in the related art.

According to a first aspect of the invention, there is provided a neuromorphic device including: a first semiconductor region formed on a substrate in a shape of protruding from a surface of the substrate; first, second, third, and fourth doped regions sequentially formed in the first semiconductor region: a first insulating film formed between at least second and third doped regions among the first to fourth doped regions and the substrate so that at least the second and third eloped regions are separated from the substrate by a predetermined distance; a first gate electrode disposed on one side surface of the second doped region, the first gate electrode being electrically isolated from the second doped region; a first gate insulating film stack disposed at, least on one side surface of the first semiconductor region where the first gate electrode is disposed; and first and second electrodes electrically connected to the first and fourth doped regions, respectively, wherein the first gate electrode and the second doped region are electrically isolated from each other by the first gate insulating film stack.

In the neuromorphic device according to the first aspect, it is preferable that the first semiconductor region 110 is formed on the substrate in a wall shape or a dumbbell shape protruding from a surface of the substrate.

In the neuromorphic device according to the first aspect, it is preferable that the neuromorphic device further includes: a second gate electrode disposed on the other side surface of the second doped region where the first gate electrode is disposed, the second gate electrode being electrically insulated from the second doped region; and a second gate insulating film stack disposed on the other side surface opposite to one side surface of the first semiconductor region where the first gate insulating film slack is disposed, wherein the second gate electrode and the second doped region are electrically inflated from each other by the second gate insulating film stack.

In the neuromorphic device according to the first aspect, it is preferable that the neuromorphic device further includes: a second gate electrode disposed on the other side surface opposite to one side surface of the second doped region where the first gate electrode is disposed, the second gate electrode being electrically insulated from the second doped region; a third gate electrode disposed on one side surface of the third doped region, the third gate electrode being electrically insulated from the third doped region; and a second gate insulating film stack disposed on the other side surface opposite to one side surface of the first semiconductor region where the first gate insulating film stack is disposed, wherein the first, second, and third gate electrodes are electrically insulated from each other and wherein the second and third gate electrodes are electrically insulated from the first semiconductor region by the second gate insulating film stack.

In the neuromorphic device according to the first aspect, it is preferable that the neuromorphic device further includes: a second gate electrode disposed on the other side surface opposite to one side surface of the second doped region where the first gate electrode is disposed, the second gate electrode being electrically insulated from the second doped region; a third gate electrode disposed on one side surface of the third doped region, the third gate electrode being electrically insulated from the third doped region; a fourth gate electrode disposed on one side surface of the fourth doped region, the fourth gate electrode being electrically insulated from the fourth doped region; a fifth gate electrode disposed on one side surface of the first doped region, the fifth gate electrode being electrically insulated from the first doped region; and a second gate insulating film stack disposed on the other side surface opposite to one side surface of the first semiconductor region where the first gate insulating film slack is disposed, wherein the first, second, third, fourth, and fifth gate electrodes are electrically insulated from each other, and wherein the second, third, fourth, and filth gate electrodes are electrically insulated front the first semiconductor region by the second gate insulating film stack.

In the neuromorphic device according to the first aspect, it is preferable that each of the first and second gate insulating film stacks are configured with a single insulating film or a stack structure where a plurality of layers including at least a charge storage layer and an insulating film are stacked, and in the case where each of the first and second gate insulating film stacks includes a charge storage layer, the charge storage layers of the first and second gate insulating film stacks ace configured to have different charge storage periods.

In the neuromorphic device according to the first aspect, it is preferable that the first and third doped regions are doped with the same type of imparities the second and fourth doped regions are doped with the same type of impurities, and the first and third doped regions are doped with impurities of which type is opposite to the type of impurities in the second and fourth doped regions.

In the neuromorphic device according to the first aspect, it is preferable that, a voltage applied to the first gate electrode is adjusted, or in the case where the first gate insulating film stock includes a charge storage layer, positive or negative charges are stored during an integrate period, so that a positive feedback operation is triggered in the second or third doped region, and a current is rapidly increased through the first to fourth doped regions to implement an integrate-and-fire function of a neuron.

In the neuromorphic device according to the first aspect, it is preferable that the first and second gate electrodes are made of materials having different work functions.

According to a second aspect of the invention, there is provided a neuromorphic circuit including: a neuromorphic device according to the first aspect; a current-voltage conversion circuit connected to the neuromorphic device to convert a current into a voltage; and one or more switch elements connected to one side surface of the neuromorphic device.

In the neuromorphic circuit according to the second aspect, it is preferable that one of the first and second gate electrodes of the neuromorphic device in the neuromorphic circuit is connected to a synapse array through a current mirror circuit, and the neuromorphic circuit includes a circuit that feedbacks an output of the current-voltage conversion circuit to the synapse array.

In the neuromorphic circuit according to the second aspect, it is preferable that a fire signal converted into a voltage at the output of the current-voltage conversion circuit is automatically applied to any one of the first and second gate electrodes of the neuromorphic device to adjust a fire threshold voltage of the neuromorphic device, and thus, a firing rate of a neuron is adjusted, so that a homeostasis function is implemented.

The neuromorphic device according to the invention has a charge storage layer having a memory function and a device structure having a positive feedback function, so that a function of a neuron that can integrate excitation inhibiting signals input from a plurality of synapses and perform firing at the time when the integrated signal exceeds a limit can be imitated.

In addition, as a substitute for a large-area capacitor implementing an integrate function in a CMOS-based neuron circuit in the related art, in the neuromorphic device according to the invention, a gate electrode having a memory function is utilized, so that the area of a neuron circuit can be greatly reduced.

In addition, in the neuromorphic device according to the invention, a gate electrode is additionally provided to adjust a voltage, so that a carrier concentration of a specific doped region can be adjusted, or a gate insulating film, stack having charge storage function is additionally provided between the electrode and the specific doped region, so that the carrier concentration of the specific doped region can be adjusted.

In addition, the neuron element having the additional gate electrode can adjust a carrier concentration of the doped region, and when a plurality of neurons are implemented as an array, a fire characteristic of the neuron element can be allowed to be uniform.

In addition, the neuromorphic device according to the invention basically has a PNPN structure and includes the above-described gate electrode and at least one additional gate electrode, and thus, a positive feedback occurs to rapidly increase a current, so that a fire function of a neuron can be imitated.

In addition, in the neuromorphic device according to the invention, the neuron element having the above-described positive feedback is used, so that the number of elements can be significantly reduced, and consequently, the area can be greatly reduced in comparison with a CMOS-based neuron circuit in the related art.

In addition, in the neuromorphic device according to the invention, an integrate-and-fire function of a neuron is imitated, and a function of converting a current flowing at the time of being fired into a voltage and a circuit of feeding back the voltage to a synapse array are provided, so that the entire functions of a neuron can be implemented.

In addition, in the neuromorphic device according to the invention, a voltage can be automatically applied to a specific gate electrode of the neuromorphic device according to the number of times of fire of the neuron element, and thus, the fire threshold voltage of the neuron is adjusted, so that a homeostasis function can be implemented.

In addition, in the neuromorphic device according to the invention, a function of storing charges in at least one of the gate electrodes is implemented, and a gate insulating film stack capable of storing charges in a long or short period of time is introduced, so that various function of a neuron can be imitated.

DETAILED DESCRIPTION OF THE INVENTION

The invention provides a neuromorphic device and a neuromorphic circuit capable of being effectively integrated with a synapse array and having a low power and a high degree of integration. In particular, since the neuromorphic device according to the invention has an integrate function of a general neuron according to a program or erase operation in a charge storage layer, a neuromorphic system can be configured very effectively in terms of area. In addition, the neuromorphic device according to the invention not only has an integrate function but also performs a positive feedback operation of electrons and holes in a neuromorphic device when a certain threshold value is reached and instantaneously transmits a signal to the next synapse to be implemented in a small area.

Conceptually, the neuromorphic device according to the invention is a vertically configured wall-shaped thin semiconductor material or a horizontally thinned semiconductor material, which is separated from a substrate by an insulating material. In addition, carriers are electrically induced or different types of impurities are implanted, and a gate insulating film stack is provided on at least one side surface of these materials. The gate insulating film stack has a memory function and a gate electrode is formed on the other side surface of the gate insulating film stack.

In addition, the neuromorphic circuit is configured by connecting a voltage-current conversion circuit and a switch to the neuromorphic device according to the invention, and n-type and p-type MOSFETs are used to constitute the voltage-current conversion circuit and the switch. These MOSFETs can be implemented on a bulk substrate or an SOI substrate, and the neuromorphic device can also be implemented on the same substrate. In the case of implementing a neuromorphic circuit on a bulk, substrate, in the neuromorphic device where gates are provided to interpose pnpn doped regions and an insulating film. two (—np—) regions among the pnpn regions need to be electrically isolated from at least the substrate.

In the invention, the threshold voltage at which the positive feedback is triggered in the pnpn junction having the gate electrode varies according to the temperature. Therefore, in order to compensate for the change in the characteristics according to the temperature, an element or a circuit block may be added.

Hereinafter, neuromorphic devices according to embodiments of the invention will be described in detail with reference to the accompanying drawings.

Figure 1A:
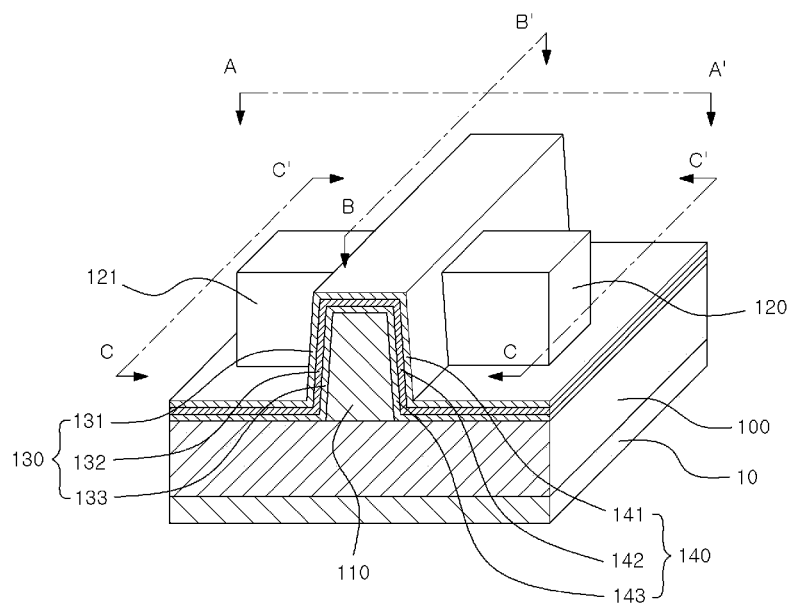
FIG. 1A is a perspective diagram illustrating a neuromorphic device according to a first embodiment of the invention.
Figure 1B:
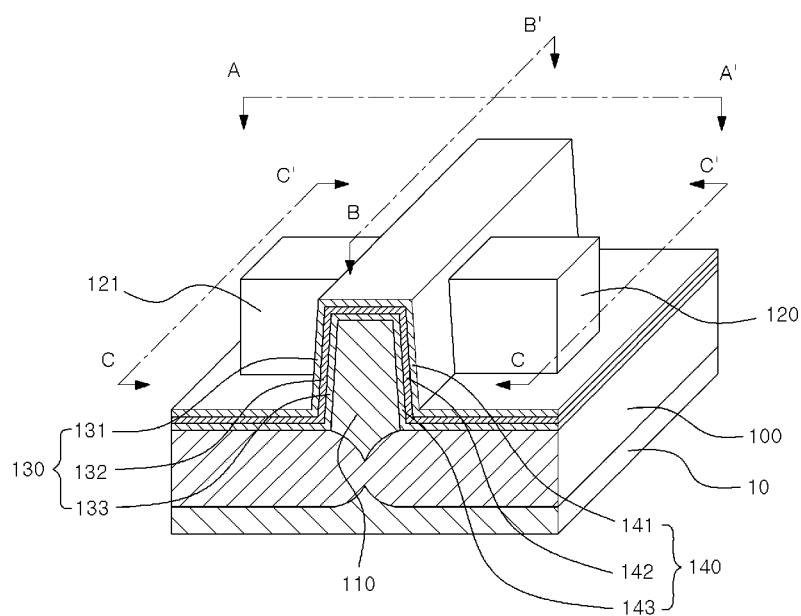
FIG. 1B is a perspective diagram illustrating a modified structure of the neuromorphic device according to the first embodiment.

FIG. 1A is a perspective diagram illustrating a neuromorphic device according to a first embodiment of the invention, and FIG. 1B is a perspective diagram illustrating a modified structure of the neuromorphic device according to the first embodiment Hereinafter, the structure and operation of the neuromorphic device according to the embodiment of the invention will be described in detail with reference to FIG. 1A.

Referring to FIG. 1A, the neuromorphic device according to the first embodiment of the invention is configured to include an initiating film 100, a substrate 10, a first semiconductor region 110 made of a semiconductor material on the substrate and formed in a vertical or horizontal thin wall shape, first, second, third, and fourth doped regions 111, 112, 113 and 114 sequentially formed in the first semiconductor region, first and second gate electrodes SG1 and SG2 (120 and 121) disposed on respective side surfaces of the second doped region, a first gate insulating film stack 130 disposed between the first gate electrode and the second doped region, and a second gate insulating film stack 140 disposed between the second gate electrode and the second doped region.

The components of the above-described neuromorphic device will be described in more detail.

As the substrate 10, a semiconductor substrate or an insulating film substrate such as an SOI (Silicon On Insulator) substrate may be used.

As the insulating film 100, an insulating film such as $SiO_2$ may be used.

The first semiconductor region 110 is formed on the substrate in a wall shape or a dumbbell shape protruding from the surface of the substrate.

The first and second gate electrodes SG1 and SG2 (120 and 121) are disposed on the respective side surfaces of the second doped region 112 and are electrically isolated from each other on the insulating film 100.

The first gate insulating film stack 130 and the second gate insulating film stack 140 are formed on the respective side surfaces of the first semiconductor region. Accordingly, the first gate insulating film stack 130 is disposed between the first gate electrode 120 and the second doped region, and the second gate insulating film stack 140 is disposed between the second gate electrode 121 and the second doped region.

FIGS. 2A, 2B, 2C, 2D, 2E, and 2F are cross-sectional diagrams taken along line A-A' in FIGS. 1A and 1B in the neuromorphic device according to the first embodiment of the invention to illustrate various examples of the first and second gate insulating film stacks.

Figure 2A:
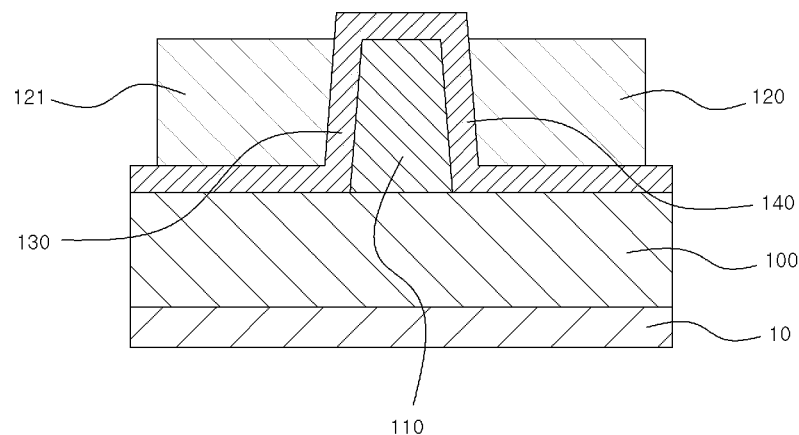
FIGS. 2A, 2B, 2C, 2D, 2E and 2F are cross-sectional diagrams taken along line A-A' in FIGS. 1A and 1B in the neuromorphic device according to the first embodiment of the invention to illustrate various examples of a gate insulating film stack.
Figure 2B:
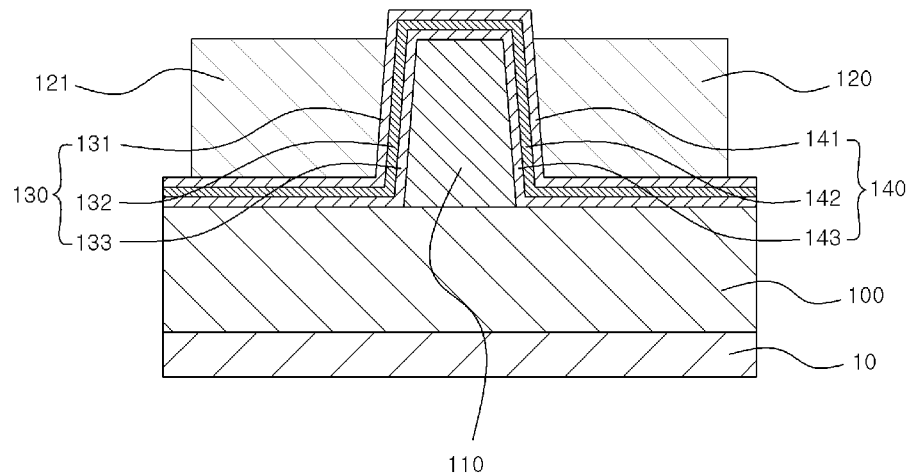

Referring to FIG. 2A each of the first, and second gate insulating film stacks 130 and 140 may be configured with a single insulating film. Referring to FIG. 2B each of the first and second gate insulating film stacks 130 and 140 may be configured with a stack structure where a plurality of insulating films are stacked, and the plurality of insulating films may include at least one charge storage layer having a charge storage function, so that a nonvolatile memory function can be implemented.

The first and second gate insulating film stacks may be configured with, for example, a stack structure of a blocking insulating film, a charge storage layer, and a tunneling insulating film, a stack structure of a charge storage layer and a tunneling insulating film, or a stack structure of a blocking insulating film and a charge storage layer.

Figure 2C:
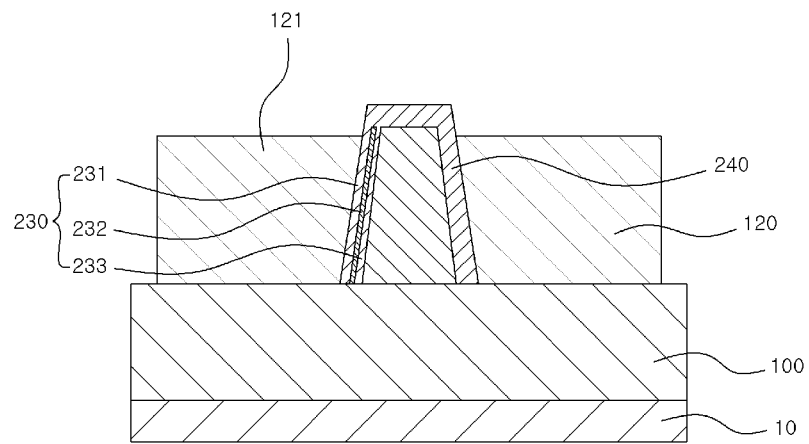
Figure 2D:
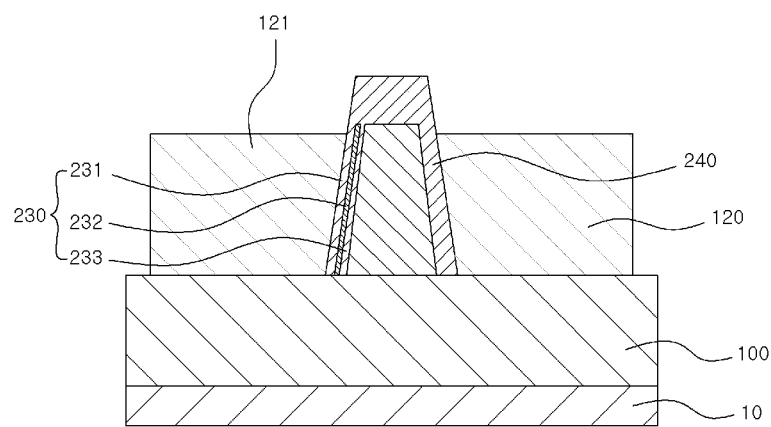

In addition, referring to FIGS. 2C and 2D, a stack structure of a plurality of insulating films 231, 232, and 233 including a charge storage layer 231 is formed in one of the first and second gate insulating film, stacks 230 and 240, so that a structure implementing a nonvolatile memory function can be formed by using a single gate. In addition, the thickness of the insulating film stack on the upper portion and one side surface of the second doped region may be formed to be different according to the function.

Figure 2E:
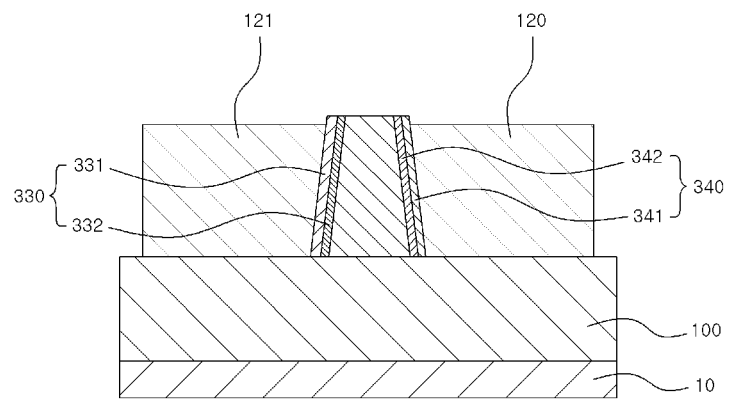
Figure 2F:
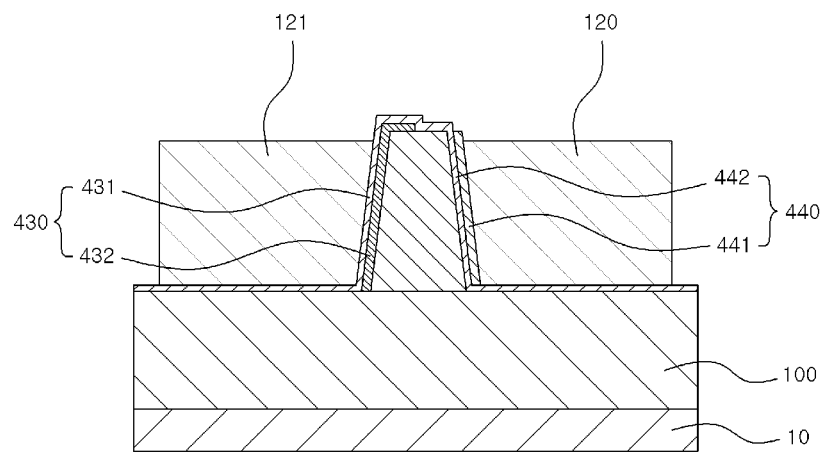

In addition, referring to FIGS. 2E and 2F the charge storage layers 332, 342, 432, and 442 of the first and second gate insulating film stacks 330, 340, 430, and 440 may be configured with a single layer or a stack structure where at least two or more layers are stacked. In the case where the charge storage layer is configured with a stack structure where at least two or more layers are stacked, the layers may be made of materials having different dielectric constants or materials having different depths of traps for storing charges.

It is also possible to implement a short-term memory that stores data for a short period of time depending on a material of the charge storage layer, a thickness of the tunneling insulating film or a stack structure. In the case where each of the first and second gate insulating film stacks includes a charge storage layer and an insulating film, in performing a program or erase operation, carriers (electrons or holes) can be programmed or erased through at least one of the first and second gate electrodes, or carriers can be programmed or erased through the second doped region. In the case where each of the first and second gate insulating film stacks includes a charge storage layer and an insulating film, in performing a program or erase operation, carriers (electrons or holes) can be programmed from at least one of the first and second gate electrodes, and after that, carriers can be erased to the second doped region, or conversely, the carriers can be erased, and after that, the carriers can be programmed.

The charge storage layers included in the first and second gate insulating film stacks may be configured so that retention periods of the stored charges are different from each other, and it is preferable that the structure and materials thereof are set according to the retention periods of charges required for the charge storage layers. The charge storage layer may be made of any one selected from a nitride film, a metal oxide, a nanoparticle, and a conductive material. This can be freely configured according to an application of the element.

The amount of charges stored in the charge storage layer of the first or second gate insulating film stack is different according to a signal applied to the first or second gate electrode, and thus, the threshold voltage of the neuromorphic device can be adjusted, so that it is possible to implement an integrate function of a neuron. In addition, in a gate insulating film stack other than the gate insulating film stack performing the integrate function of the neuron, charges are stored in the charge storage layer according to the increase in the number of times of operating of the neuron to adjust the threshold voltage of the neuromorphic device, and thus, a firing rate of the neuron is adjusted, so that a homeostasis function can be implemented.

Figure 3A:
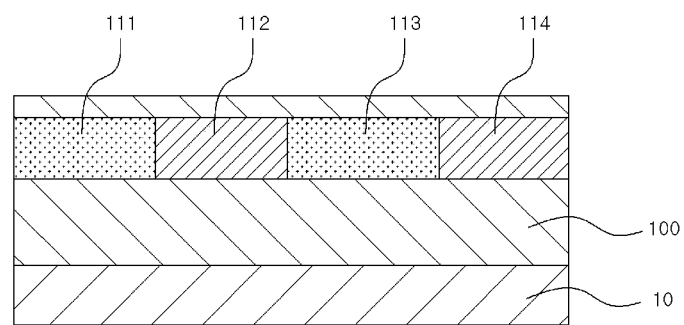
FIGS. 3A and 3B are cross-sectional diagrams taken along line B-B' in FIGS. 1A and 1B in the neuromorphic device according to the first embodiment of the invention to illustrate various examples where the neuromorphic device is insulated from the substrate.
Figure 3B:
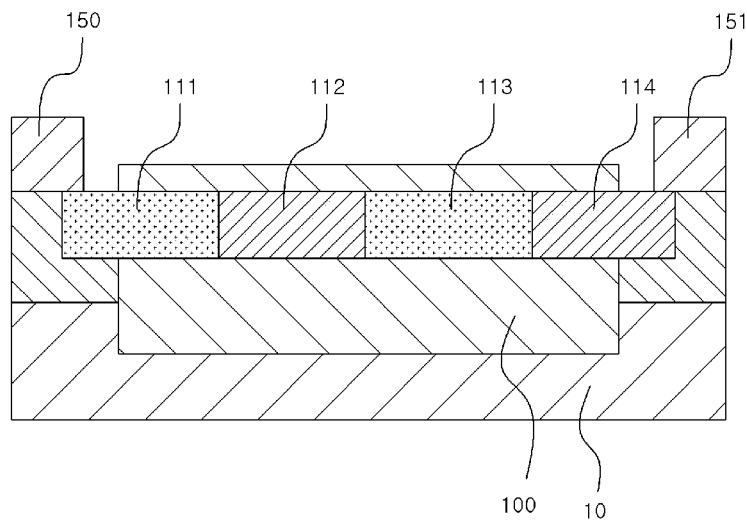

In the neuromorphic device according to the first embodiment of the invention, FIG. 3A is across-sectional diagram taken along line B-B' in FIGS. 1A and 1B to illustrate the case where the neuromorphic device is insulated from the substrate, and FIG. 3B is across-sectional diagram taken along line B-B' in FIGS. 1A and 1B to illustrate anther example of the neuromorphic device.

The first semiconductor region is formed on the insulating film 100 and is configured to include sequentially formed first, second, third, and fourth doped regions 111, 112, 113, and 114. In addition, in the first second, third, and fourth doped regions, it is preferable that the first, second, third, and fourth doped regions are formed by implanting different types of impurities. It is preferable that the first and third doped regions are doped with the same type of impurities, the second and fourth doped regions are doped with the same type of impurities, and the first and third doped, regions are doped with impurities of which type is opposite to the type of impurities in the second and fourth doped regions.

FIG. 3B is a cross-sectional diagram illustrating another embodiment where an insulating structure is implemented between the substrate and the first semiconductor region in the neuromorphic device according to the invention.

Referring to FIG. 3B, in another embodiment where the insulating structure is implemented between the substrate and the first semiconductor region, at least the second and third doped regions among the first to fourth doped regions are separated by a predetermined distance from the substrate 10 by the insulating film 100, and at least any one of the first and fourth doped regions is connected to the substrate.

In the case where the type of impurities in the first or fourth doped region connected to the substrate is the same as the type of impurities in the substrate, it is preferable that, in order to prevent leakage currents occurring in the silicon substrate and other doped regions, a well doped wish impurities of which type is opposite to the type of impurities in the substrate is formed, and the doped region is formed in the well.

In addition, it is preferable that the first and second electrodes 150 and 151 are electrically connected to the first and fourth doped regions, respectively, and the first and second electrodes may be made of the same material.

Figure 4:
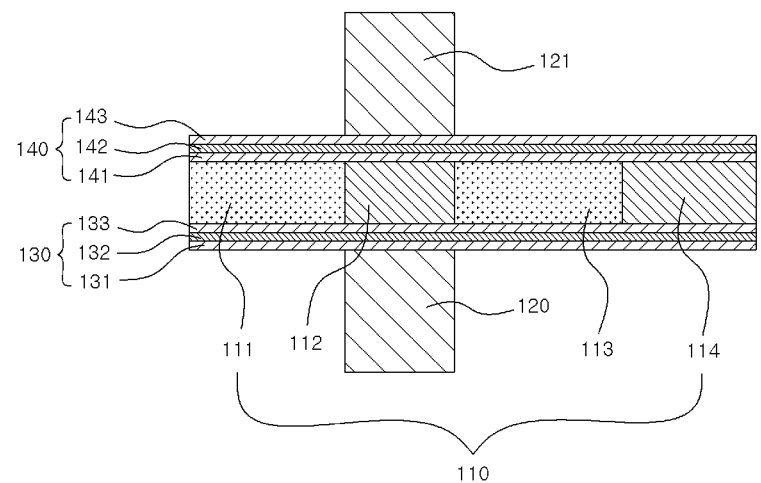
FIG. 4 is a cross-sectional diagram taken along line C-C in FIGS. 1A and 1B in the neuromorphic device according to the first embodiment of the invention.

FIG. 4 is a cross-sectional diagram taken along line C-C of FIGS. 1A and 1B in a neuromorphic device according to a first embodiment of the invention.

Referring to FIG. 4, the first and second gate insulating film stacks 130 and 140 are formed on the side surfaces of the first, second, third, and fourth doped regions 111, 112, 113 and 114, and the first and second gate electrodes 120 and 121 are disposed on the respective side surfaces of the second doped region 112 to interpose the first and second gate insulating film stacks 130 and 140.

Therefore, the neuromorphic device according to the invention is conceptually a first semiconductor region which forms a junction between a first electrode and second electrode and second gate insulating film stacks are formed on both side surfaces of the first semiconductor region The first and second gate insulating film stacks may have a memory function and first and second gate electrodes are formed on the other side surfaces of the first and second gate insulating film stacks, respectively.

Figure 5:
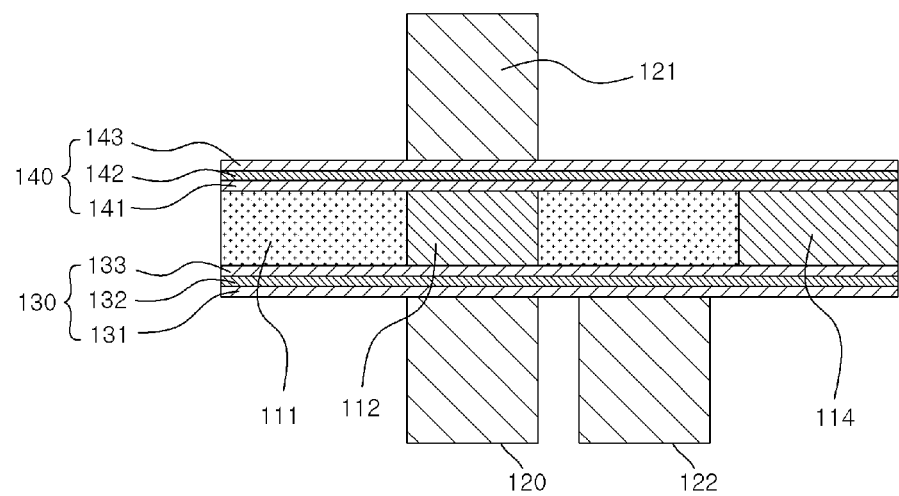
FIG. 5 is a cross-sectional diagram illustrating a neuromorphic device according to a second embodiment of the invention.

FIG. 5 is a perspective diagram of a neuromorphic device according to a second embodiment of the invention. Referring to FIG. 5, the neuromorphic device according to the second embodiment of the invention has a structure similar to that of the neuromorphic device according to the first embodiment, except that a third gate electrode 122 is further included to be disposed on one side surface of the third doped region.

The third gate electrode 122 is disposed at one side surface of the third doped region, and a first or second gate insulating film stack is disposed between the third gate electrode and the third doped region. The third gate electrode 122 is electrically isolated from the first and second gate electrodes. In the case where the first or second gate insulating film, includes a charge storage layer, by the amount of charges stored in the charge storage layer of the first or second gate insulating film stack existing on the side surface of the third gate electrode and the voltage applied to the third gate electrode, the carrier concentration of the third doped region can be adjusted.

Figure 6:
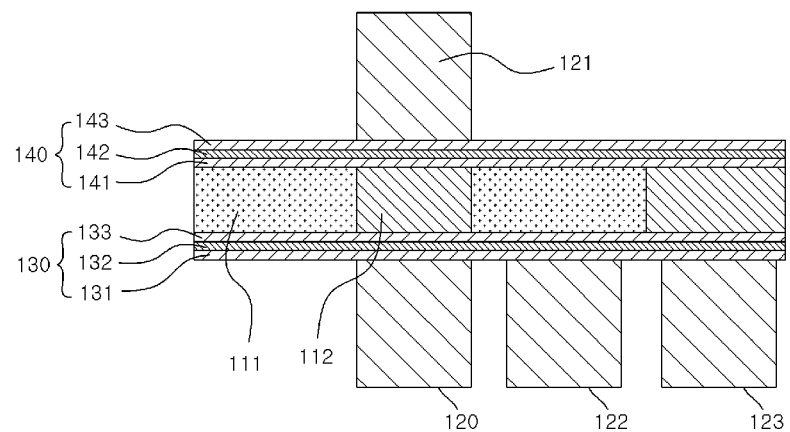
FIG. 6 is a cross-sectional diagram illustrating a neuromorphic device according to a third embodiment of the invention.

FIG. 6 is a perspective diagram of a neuromorphic device according to a third embodiment of the invention. Referring to FIG. 6, the neuromorphic device according to the third embodiment of the invention has a structure similar to that of the neuromorphic device according to the first embodiment, except that a third gate electrode 122 and a fourth gate electrode 123 are further included to be disposed on side surfaces of the third doped region and the fourth doped region, respectively.

A first or second gate insulating film stack is disposed between the third gate electrode and the third doped region and between the fourth gate electrode and the fourth doped region. The third gate electrode is electrically isolated from, the first, second, and fourth gate electrodes, and the fourth gate electrode is electrically isolated from the first, second, and third gate electrodes. In the case where the first or second gate insulating film includes the charge storage layer, by the amount of charges stored in the charge storage layer of the first or second gate insulating film stack existing on the side surface of the third gate electrode and the voltage applied to the third gate electrode, the carrier concentration of the third doped region can be adjusted. In addition, in the case where the first or second gate insulating film includes a charge storage layer, by the amount of charges stored in the charge storage layer of the first or second gate insulating film stack existing on the side surface of the fourth gate electrode and the voltage applied to the fourth gate electrode, the carrier concentration of the fourth doped region can be adjusted.

Figure 7:
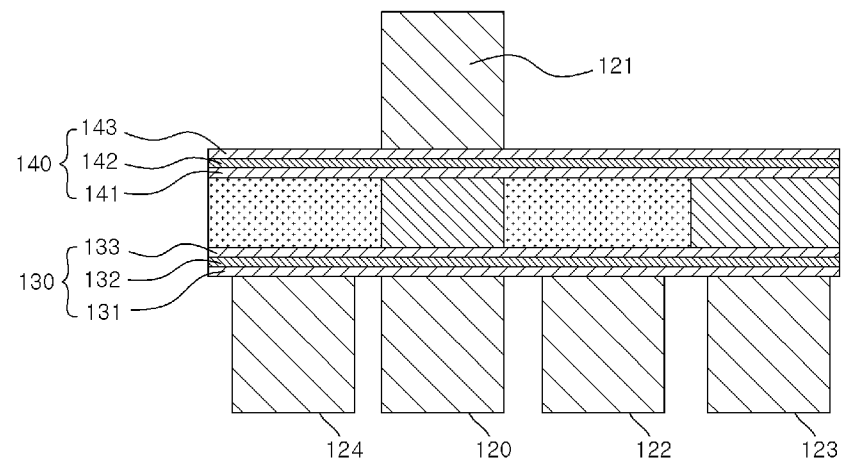
FIG. 7 is a cross-sectional diagram illustrating a neuromorphic device according to a fourth embodiment of the invention.

FIG. 7 is a perspective diagram of a neuromorphic device according to a fourth embodiment of the invention. Referring to FIG. 7, the neuromorphic device according to the fourth embodiment of the invention has a structure similar to that of the neuromorphic device according to the first embodiment, except that third, fourth, and fifth gate electrodes are further included to be disposed on side surfaces of the third, fourth, and first doped regions, respectively. A first or second gate insulating film stack is disposed between the third gate electrode and the third doped region, between the fourth gate electrode and the fourth doped region, and between the fifth gate electrode and the first doped region. The first, second, third, fourth, and fifth gate electrodes are electrically isolated from each other. In the case where the first or second gate insulating film stack includes the charge storage layer, by the amount of charges stored in the charge storage layer of the first or second gate insulating film stack existing on the side surface of the fifth gate electrode and the voltage applied to the fifth gate electrode, the carrier concentration, of the first doped region can be adjusted. In addition, in the case where the first or second gate insulating film includes a charge storage layer, by the amount of charges stored in the charge storage layer of the first or second gate insulating film stack existing on the side faces of the third and fourth gate electrodes and the voltages applied to the third and fourth gate electrodes, the carrier concentration of the third or fourth doped region can be adjusted.

Figure 8:
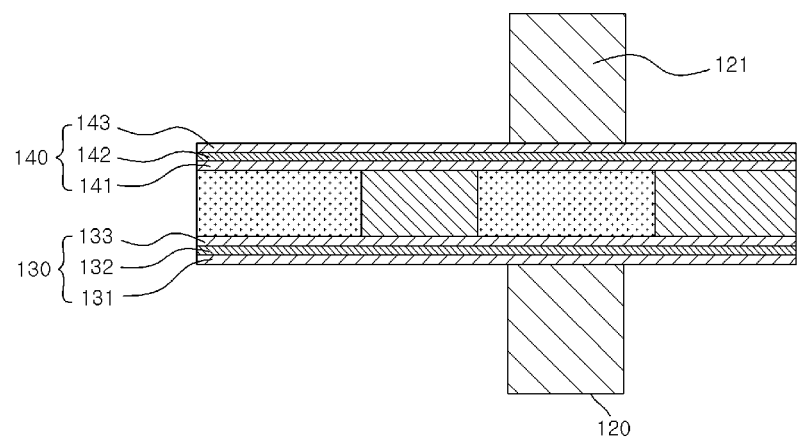
FIG. 8 is a cross-sectional diagram illustrating a neuromorphic device according to a fifth embodiment of the invention.

FIG. 8 is a perspective diagram of a neuromorphic device according to a fifth embodiment of the invention. Referring to FIG. 8, the neuromorphic device according to the fifth embodiment of the invention has a structure similar to that of the neuromorphic device according to the first embodiment, except that the first and second gate electrodes are formed on the respective sides of the third doped region. By the amount of charges stored in the charge storage layers of the first and second gate insulating film stacks existing on the side surfaces of the first and second gate electrodes and the voltages applied to the first and second gate electrodes, the carrier concentration of the third doped region can be adjusted.

Figure 9:
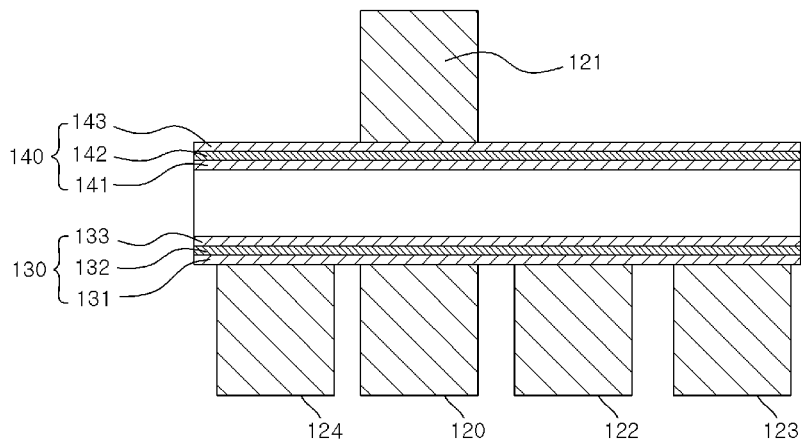
FIG. 9 is a cross-sectional diagram illustrating a neuromorphic device according to a sixth embodiment of the invention.

FIG. 9 is a perspective diagram of a neuromorphic device according to a sixth embodiment of the invention. Referring to FIG. 8, the neuromorphic device according to the sixth embodiment of the invention has a structure similar to that of the neuromorphic device according to the fourth embodiment, except that impurities are not implanted into the first semiconductor region. In addition, the carriers are electrically induced by the amount of charges stored in the charge storage layer of the gate insulating film stack existing on the side surface of each gate electrode and the voltages applied to the respective first to fifth gate electrodes, read thus, the carrier concentrations of the first, second, third, and fourth doped regions are adjusted.

Figure 10:
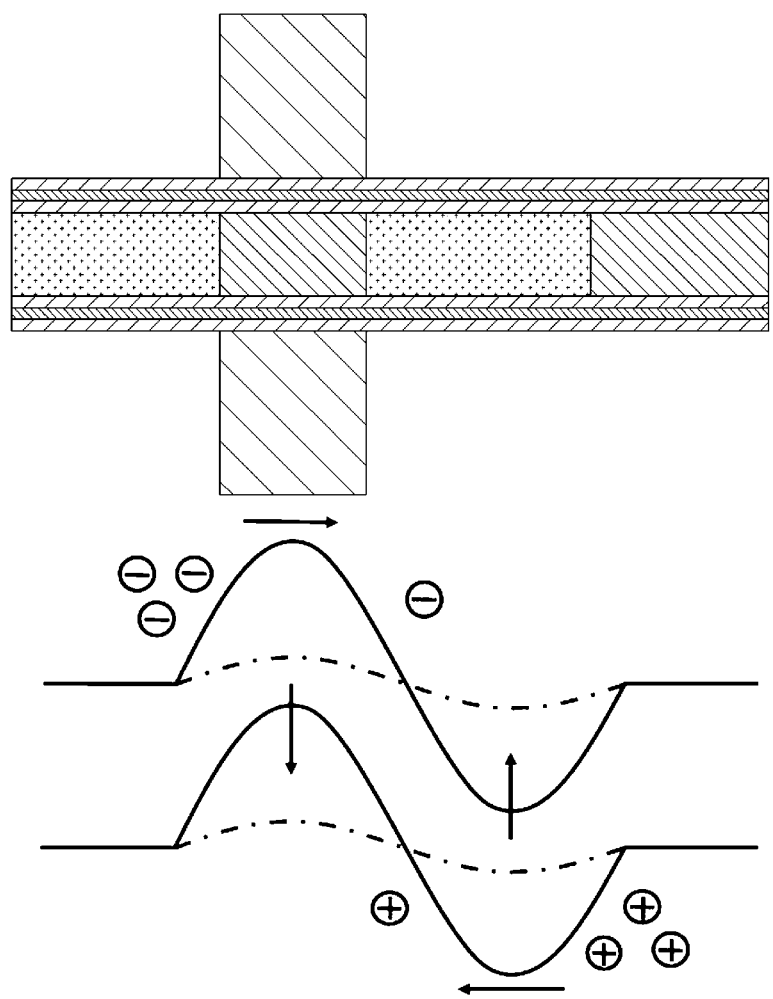
FIG. 10 illustrates a cross-sectional diagram, and energy hand of the neuromorphic device according to the first embodiment of fee invention.

FIG. 10 illustrates energy band of the neuromorphic device according to the first embodiment of the invention. In the neuromorphic device according to the invention, an energy barrier is formed between the first and fourth doped regions due to the junction of the second and third doped regions into which different types of impurities are implanted. In addition, it is possible to adjust the energy band barrier of the energy band due to the voltages applied to the third, fourth, and fifth gate electrodes of the neuromorphic devices according to the second, third, fourth, fifth and sixth embodiments described above.

In the neuromorphic devices according to the first, second, third, fourth, fifth, and sixth embodiments of the invention, it is possible to implement a fire function of a neuron through a positive feedback operation of electrons and holes in the second and third doped regions. The implementation of the fire function of the element is described as follows. In the neuromorphic device according to the invention, when a voltage is applied to the first gate electrode, the energy band barrier of the second doped region becomes lower, and the energy barrier between the first and third doped regions becomes lower, so that electrons are moved from the first doped region to the third doped region. Due to the moved electrons, the energy band barrier of the third doped region is also lowered, so that holes are smoothly moved from the fourth doped region to the second doped region. In this case, since the energy band of the second doped region becomes lower, more electrons are moved from the first doped region to the third doped region, and the moved carriers are rapidly increased. In this specification, this phenomenon is referred, to as a positive feedback operation of electrons and holes. Therefore, when a signal, equal to or higher than the threshold voltage is input from outside, the positive feedback operation is triggered, and the current is rapidly increased through the first to fourth doped regions, so that the fire function of the neuron can be implemented.

In addition, in the neuromorphic devices according to the first, second, third, fourth, fifth, and sixth embodiments of the invention, the carriers can be programmed or erased for each element by using the first, second, third, fourth, and fifth gate electrodes. In the neuromorphic device according to the invention, it is possible to implement the integrate function of the neuron by reconstructing the functions of the elements through the above-described program and erase.

The neuromorphic devices according, to the first, second, third, fourth, fifth, and sixth embodiments of the invention having the above-described configuration are configured with diodes having gates, and implementation of the integrate function of the elements is described as follows.

First, it is assumed that an external signal is transferred from the synapses to the first gate electrode. As an example, a positive signal lower than the threshold voltage of the element is transferred from the synapse, and a tunneling insulating film is formed on the side surface of the gate electrode. When holes are implanted, from the gate electrode to erase carriers, the threshold voltage of the element is gradually lowered. When a signal higher than the set threshold voltage is applied from the synapse, a current flows in the element due to positive feedback of electrons and holes. On the other hand, when a negative signal is applied to the first gate electrode, electrons are implanted from the first gate electrode to program carriers, and thus, the threshold voltage of the element is heightened to return the neuromorphic device to the initial state. The program and erase of the neuromorphic device described above can be implemented by using the integrate and reset functions of the neuron. As a result, due to these functions, the integrate-and-fire function of the neuron can be reliably implemented in a very small area, and stimuli from the outside can be transmitted.

Figure 11:
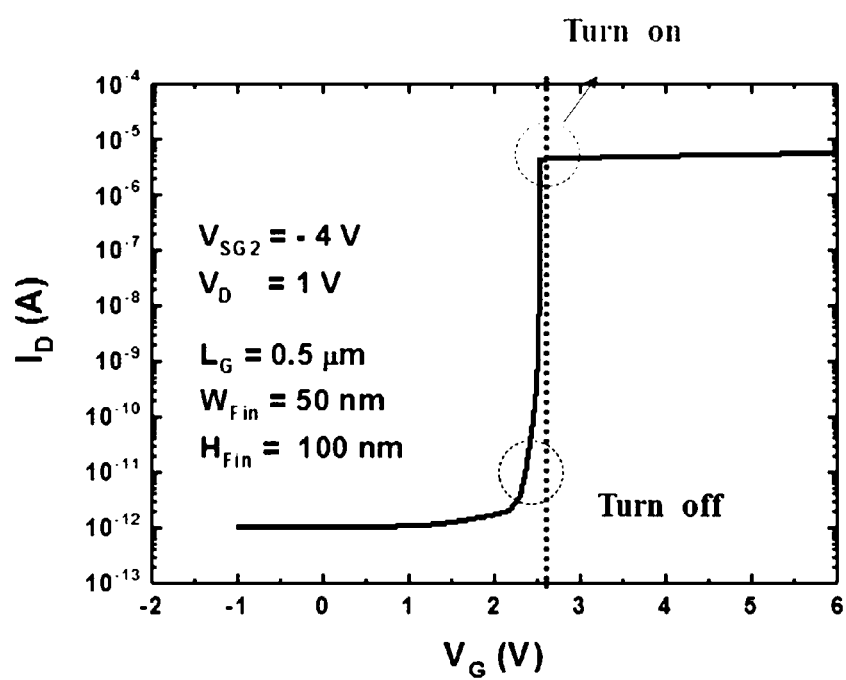
FIG. 11 is a graph illustrating a voltage-current operating characteristic of a neuromorphic device according to the invention.
Figure 12:
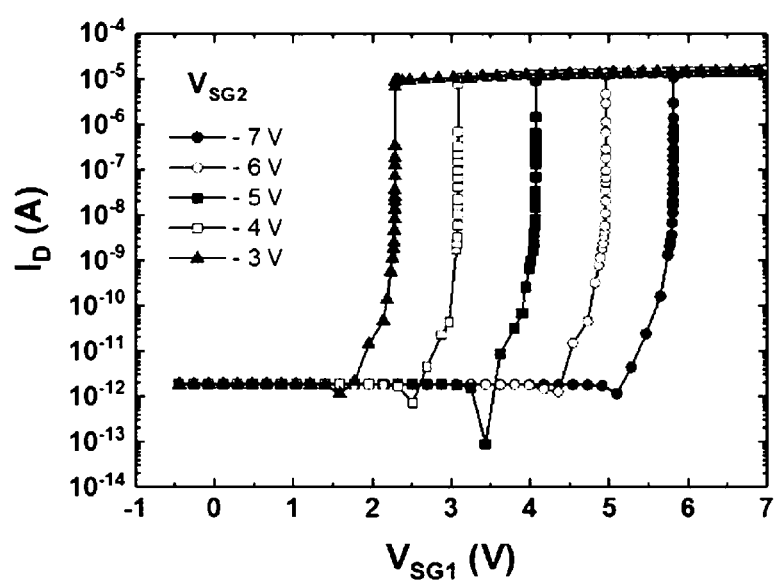
FIG. 12 is a graph illustrating a voltage-current operating characteristic of a neuromorphic device according to the invention according to a voltage applied to another electrode.

FIG. 11 is a graph illustrating a voltage-current operating characteristic of the neuromorphic device according to the first embodiment of the invention. As an example, the case where a voltage is externally applied to the first gate electrode is illustrated. When a voltage lower than the threshold voltage of the element is applied to the first gate electrode, the energy band barrier of the second doped region is high, and thus, there is little movement of electrons in the first doped region, so that no current flows. On the other hand, when a voltage equal to or higher than a specific value is applied to the first gate electrode, electrons move in the first doped region, and electrons and holes move together to generate a positive feedback effect, so that a current flows instantaneously. In addition, referring to FIG. 12, the threshold voltage of the neuromorphic device can be adjusted by using the second gate electrode and the second gate insulating film stack. When a negative voltage is applied to the second gate electrode or electrons are implanted into the second gate insulating film stack, the energy band of the second doped region is heightened to hinder the movement of electrons. Therefore, a higher voltage is applied to the first gate electrode so that a current can flow.

With this setting, the threshold value of the neuron is adjusted according to the number of times of fire in which the neuron transmits a signal to the next neuron, and thus, a firing rate is adjusted, so that the homeostasis function can be implemented.

Figure 13:
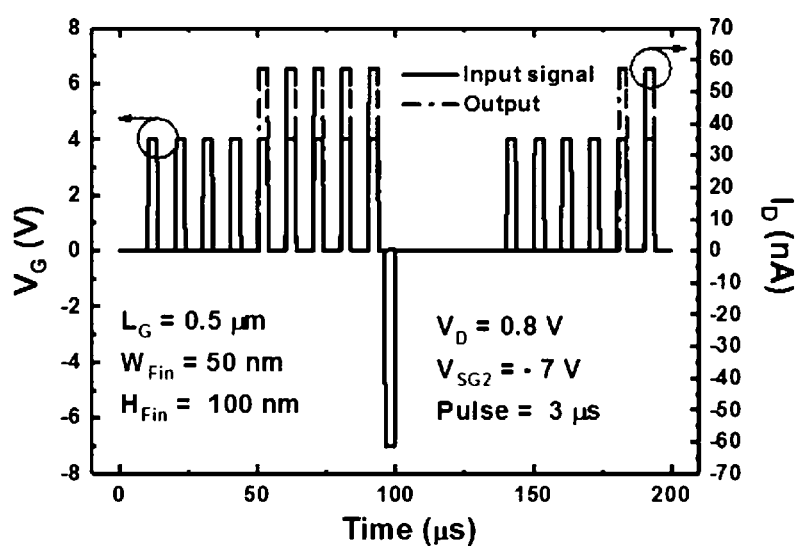
FIG. 13 is a graph illustrating a voltage-current operating characteristic of a neuromorphic device according to the invention according to an amount of electrons or holes stored in a charge storage layer in the neuromorphic device.

Referring to FIG. 13, as an example of the neuromorphic device according to the first embodiment of the invention, when a positive voltage is applied to the first gate electrode four times to implant holes into the first gate insulating film stack, the threshold voltage is gradually lowered. However, since the applied positive voltage is lower than the threshold voltage of the element, no current flows. On the other hand, in the case where the next applied positive voltage is higher than a lower threshold voltage of the element, a current flows in addition, when a reset voltage is applied to set the first gate insulating film stack to be in an initial state and the same voltage is applied, the same operating characteristics are exhibited. The operating characteristics are very similar to the integrate-and-fire functions of a biological neuron, and the biological neuron can be reliably imitated by using a single element.

Figure 14A:
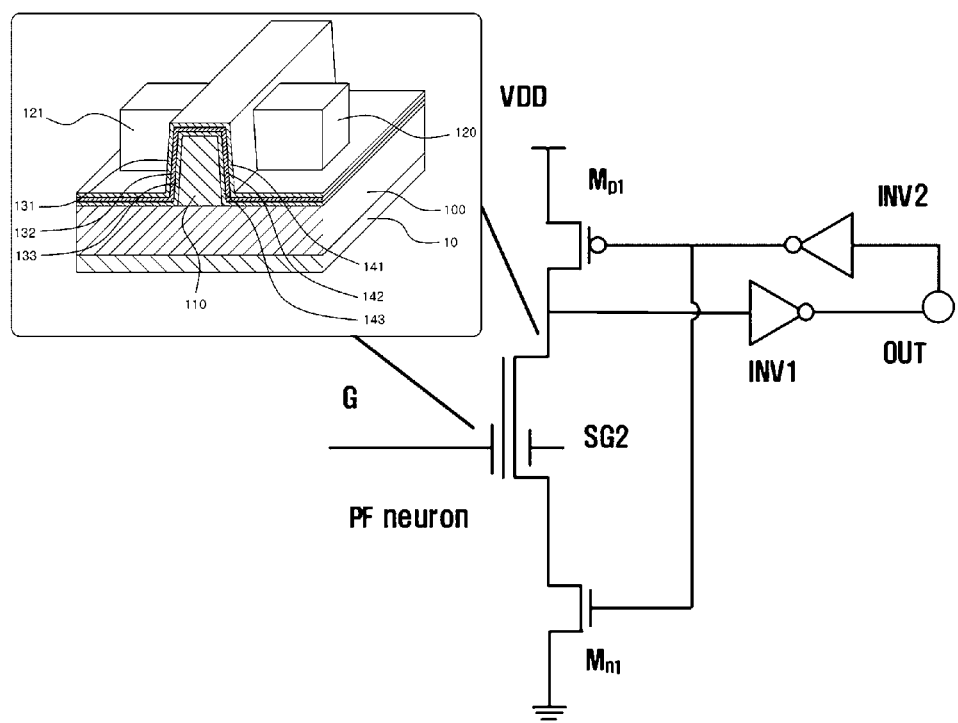
FIG. 14A is a circuit diagram in which a neuromorphic device according to the invention is connected to a current-voltage conversion circuit.

FIG. 14A is a circuit diagram in which a neuromorphic device according to the invention and a current-voltage conversion circuit are connected. The current-voltage conversion circuit is configured to include an-MOSFET and a p-MOSFET, and the n-MOSFET and the p-MOSFET are formed simultaneously in terms of the processes of manufacturing the neuromorphic device. Referring to FIG. 14A, when a signal is applied from an external synapse to the first gate electrode, charges are accumulated in the first gate insulating film stack, and thus, a current flows in the neuromorphic device. Therefore, the potential of the input terminal of an inverter INV1 is decreased, and the potential of the OUT node which is the output terminal is increased. Therefore, a signal is transmitted to the next synapse and neuron.

Figure 14B:
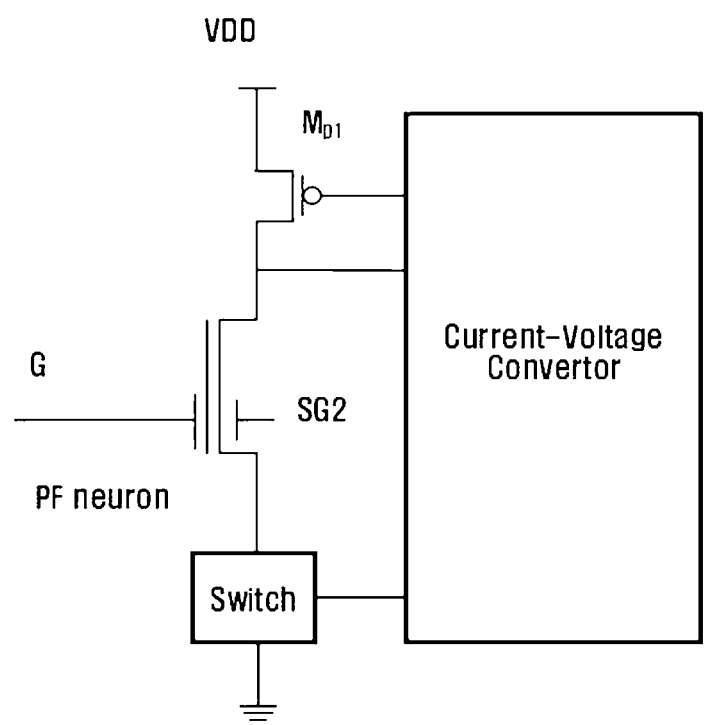
FIGS. 14B and 14C are conceptual diagrams of a synapse array and a neuromorphic circuit using the neuromorphic device according to the invention.
Figure 14C:
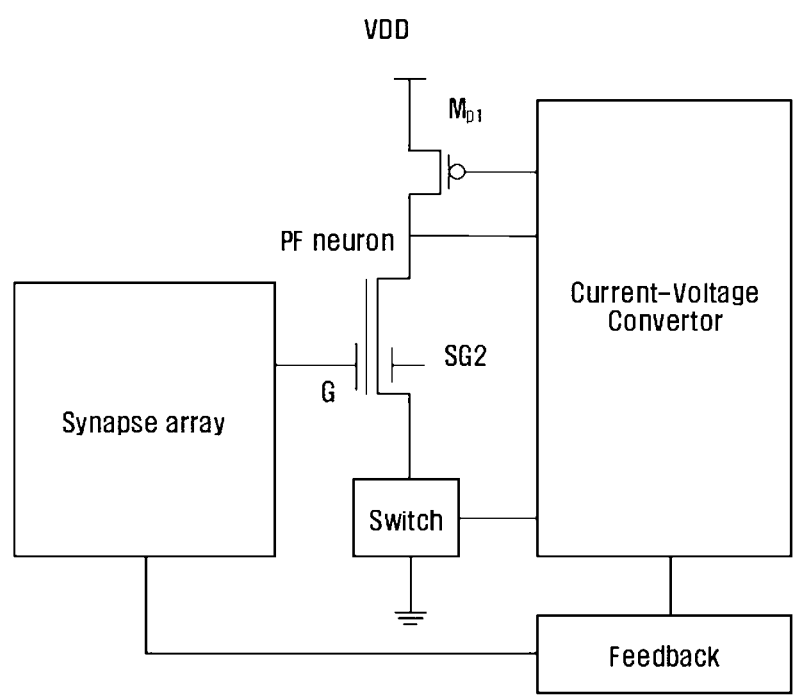

FIGS. 14B and 14C are conceptual diagrams of a synapse array and a neuromorphic circuit using the neuromorphic device according to the invention. In the neuromorphic circuit, one of the first and second gate electrodes of the neuromorphic device is connected to the synapse array through the current mirror circuit block, and the output of the circuit block for converting a current into a voltage is fed back to the synapse array, so that synapse learning can be performed through the circuit block.

Figure 15:
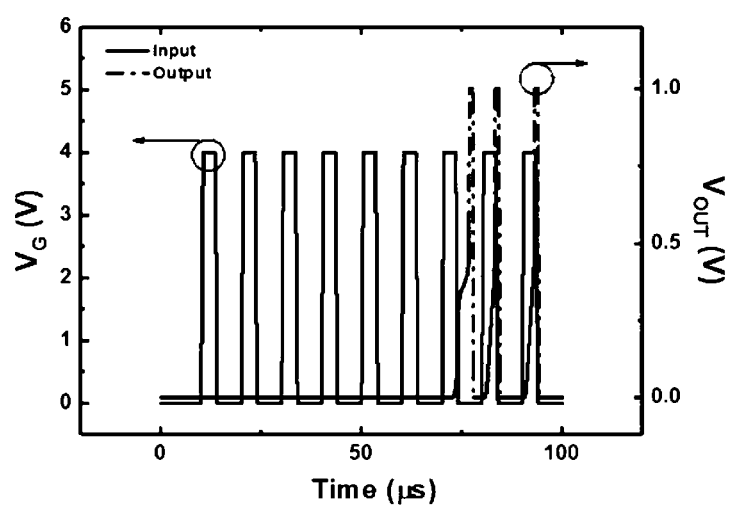
FIG. 15 is a graph illustrating operating characteristics of the neuromorphic device and circuit of FIG. 14A in the neuromorphic device according to the invention.

FIG. 15 illustrates operating characteristics of the neuromorphic circuit illustrated in FIG. 14A as a voltage graph with respect to time, which can implement an integrate function and a fire function of the neuron. In addition, a fire signal converted to a voltage at the output of the current-voltage conversion circuit is automatically applied to any one of the first and second gate electrodes of the neuromorphic device, so that a fire threshold voltage of the neuromorphic device adjusted, and thus, a firing rate of the neuron is adjusted, so that the homeostasis function can be implemented.

While the invention has been particularly illustrated and described with reference to exemplary embodiments thereof, it will be understood by the skilled in the art that the invention is not limited to the embodiments, but various modifications and applications not illustrated in the above description can be made without departing from the sprit and scope of the invention. It should be understood that different features in the modifications and applications are included in the scope of the invention defined by the claims.

In a neuromorphic device according to the invention, since the degree of integration can be increased due to its small size and the neuromorphic device is reliable based on silicon technology and can implement various functions to be implemented in neuromorphic technology, the neuromorphic device can be widely used in the field of neuromorphic technology.

What is claimed is:

1. A neuromorphic device comprising:
   a first semiconductor region formed on a substrate in a shape of protruding from a surface of the substrate;
   first, second, third, and fourth doped regions sequentially formed in the first semiconductor region;
   a first insulating film formed between at least second and third doped regions among the first to fourth doped regions and the substrate so that at least the second and third doped regions are separated from the substrate by a predetermined distance;
   a first gate electrode disposed on one side surface of the second doped region, the first gate electrode being electrically isolated from the second doped region;
   a first gate insulating film stack disposed at least on one side surface of the first semiconductor region where the first gate electrode is disposed, and
   first and second electrodes electrically connected to the first and fourth doped regions, respectively,
   wherein the first gate electrode and the second doped region are electrically isolated from each other by the first gate insulating film stack.

2. The neuromorphic device according to claim 1, further comprising:
   a second gate electrode disposed on the other side surface opposite to one side surface of the second doped region where the first gate electrode is disposed, the second gate electrode being electrically insulated from the second doped region; and
   a second gate insulating film stack disposed on the other side surface opposite to one side surface of the first semiconductor region where the first gate insulating film stack is disposed,
   wherein the second gate electrode and the second doped region are electrically insulated from each other by the second gate insulating film stack.

3. The neuromorphic device according to claim 1, further comprising:
   a second gate electrode disposed on the other side surface opposite to one side surface of the second doped, region where the first gate electrode is disposed, the second gate electrode being electrically insulated from the second doped region;
   a third gate electrode disposed on one side surface of the third doped region, the third gate electrode being electrically insulated from the third doped region; and
   a second gate insulating film stack disposed on the other side surface opposite to one side surface of the first semiconductor region where the first gate insulating film stack is disposed,
   wherein the first, second, and third gate electrodes are electrically insulated from each other, and
   wherein the second and third gate electrodes are electrically insulated from the first semiconductor region by the second gate insulating film stack.

4. The neuromorphic device according to claim 1, further comprising:
   a second gate electrode disposed on the other side surface opposite to one side surface of the second doped region where the first gate electrode is disposed, the second gate electrode being electrically insulated from the second doped region;
   a third gate electrode disposed on one side surface of the third doped region, the third gate electrode being electrically insulated from the third doped region;
   a fourth gate electrode disposed on one side surface of the fourth doped region, the fourth gate electrode being electrically insulated from the fourth doped region;
   a fifth gate electrode disposed on one side surface of the first doped region, the fifth gate electrode being electrically insulated from the first doped region; and
   a second gate insulating film stack disposed on the other side surface opposite to one side surface of the first semiconductor region where the first gate insulating film stack is disposed,
   wherein the first, second, third, fourth, and fifth gate electrodes are electrically insulated from each other, and
   wherein the second, third, fourth, and fifth gate electrodes are electrically insulated from the first semiconductor region by the second gate insulating film stack.

5. The neuromorphic device according to claim 1, wherein the first gate insulating film stack is configured with a single insulating film or a stack structure where a plurality of layers including at least a charge storage layer and an insulating film are stacked.

6. The neuromorphic device according to claim 2, wherein each of the first and second gate insulating film stacks are configured with a single insulating film or a stack structure where a plurality of layers including at least a charge storage layer and an insulating film are stacked.

7. The neuromorphic device according to claim 2,
wherein each of the first and second gate insulating film stacks is configured with a single insulating film or a stack structure where a plurality of layers including at least a charge storage layer and an insulating film are stacked, and
wherein, in the case where each of the first and second gate insulating film stacks includes a charge storage layer, the charge storage layers of the first and second gate insulating film stacks are configured to have different charge storage periods.

8. The neuromorphic device according to claim 1,
wherein the first and third doped regions are doped with the same type of impurities,
wherein the second and fourth doped regions are doped with the same type of impurities, and
wherein the first and third doped regions are doped with impurities of which type is opposite to the type of impurities in the second and fourth doped regions.

9. The neuromorphic device according to claim 5, wherein, a voltage applied to the first gate, electrode is adjusted, or in the case where the first gate insulating film stack includes a charge storage layer, positive or negative charges are stored during an integrate period, so that a positive feedback operation is triggered in the second or third doped region, and a current is rapidly increased through, the first to fourth, doped regions to implement an integrate-and-fire function of a neuron.

10. The neuromorphic device according to claim 7, wherein, a voltage applied to the first or second gate electrode is adjusted, or in the case where the first and second gate insulating film, stacks include a charge storage layers, positive or negative charges are stored during an integrate period, so that a positive feedback operation is triggered in the second or third doped region, and a current is rapidly increased through the first to fourth doped regions to implement an integrate-and-fire function of a neuron.

11. The neuromorphic device according to claim 2, wherein, the first and second gate electrodes are made of materials having different work functions.

12. The neuromorphic device according to claim 6, wherein, in the case where each of the first and second gate insulating film stacks includes a charge storage layer and an insulating film, in program or erase operation, carriers (electrons or holes) are programmed or erased through at least one of the first and second gate electrodes, or carriers are programmed or erased through at least one of the second and third doped regions.

13. The neuromorphic device according to claim 6, wherein, in the case where each of the first and second gate insulating film stocks includes a charge storage layer and an insulating film, in program and erase operations, carriers (electrons or holes) from at least one of the first and second gate electrodes are programmed, and after that, carriers are erased to at least one of the second and third doped regions, or conversely, the carriers are erased and programmed.

14. The neuromorphic device according to claim 6, wherein, a carrier concentration of the second doped region is adjusted by adjusting a voltage of at least one of the first and second gate electrodes, or in the case where each of the first and second gate insulating film stacks include a charge storage layer, the carrier concentration of the second and third doped regions is adjusted by adjusting a stored current amount.

15. The neuromorphic device according to claim 1,
wherein at least one of the first and fourth doped regions is connected to the substrate, and
wherein, if the type of impurities in the doped region connected to the substrate is the same as the type of impurities in the substrate, the doped region is formed in a well doped with impurities of which type is opposite to the type of impurities in the substrate.

16. The neuromorphic device according to claim 2,
wherein at least one of the first and fourth doped regions is connected to the substrate, and
wherein, if the type of impurities in the doped region connected to the substrate is the same as the type of impurities in the substrate, the doped region is formed in a well doped with impurities of which type is opposite to the type of impurities in the substrate.

17. The neuromorphic device according to claim 1, wherein the first gate electrode is disposed on one side surface, a side surface opposite to the one side surface, and an upper portion of the second doped region, and the first gate insulating film stack is disposed between the first gate electrode and the second doped region so as to isolate electrically the first gate electrode from the second doped region.

18. A neuromorphic circuit comprising:
a neuromorphic device;
a current-voltage conversion circuit connected to the neuromorphic device to convert a current into a voltage; and
one or more switch elements connected to one side surface of the neuromorphic device,
wherein the neuromorphic device includes:
a first semiconductor region formed on a substrate in a shape of protruding from the substrate;
first, second, third, and fourth doped regions sequentially formed in the first semiconductor region;
a first insulating film formed between at least second and third doped regions among the first to fourth doped regions and the substrate so that at least the second and third doped regions are separated from, the substrate by a predetermined distance;
a first gate electrode disposed on one side surface of the second doped region, the first gate electrode being electrically insulated from the second doped region;
a first gate insulating film stack disposed between one side surface of the second doped region and the first gate electrode;
a second gate electrode disposed on the other side surface opposite to one side surface of the second doped region where the first gate electrode is disposed, the second gate electrode being electrically insulated from the second doped region;
a second gate insulating film stack, disposed between the second gate electrode and the other side surface opposite to one side surface of the second doped region where the first gate insulating film stack is disposed; and
first and second electrodes electrically connected to the first and fourth doped regions, respectively.

19. The neuromorphic circuit according to claim 18,
wherein the of the first and second gate electrodes of the neuromorphic device in the neuromorphic circuit is connected to a synapse array through a current mirror circuit, and
wherein the neuromorphic circuit comprises a circuit that feedbacks an output of the current-voltage conversion circuit to the synapse array.

20. The neuromorphic circuit according to claim 18, wherein a fire signal converted into a voltage at the output of the current-voltage conversion circuit is automatically applied to any one of the first and second gate electrodes of the neuromorphic device to adjust a fire threshold voltage of the neuromorphic device, and thus, a firing rate of a neuron is adjusted, so that a homeostasis function is implemented.

* * * * *